United States Patent [19]

Taniguchi

[11] Patent Number: 5,399,510
[45] Date of Patent: Mar. 21, 1995

[54] METHOD OF FABRICATING A SEMICONDUCTOR DEVICE

[75] Inventor: Akihisa Taniguchi, Itami, Japan

[73] Assignee: Mitsubishi Denki Kabushiki Kaisha, Tokyo, Japan

[21] Appl. No.: 190,496

[22] Filed: Feb. 2, 1994

Related U.S. Application Data

[62] Division of Ser. No. 815,044, Dec. 31, 1991, Pat. No. 5,323,056.

[30] Foreign Application Priority Data

Jan. 8, 1991 [JP] Japan .................. 3-000357

[51] Int. Cl.$^6$ ......................................... H01L 21/265
[52] U.S. Cl. ......................... 437/31; 437/915; 437/974; 148/DIG. 10; 148/DIG. 135
[58] Field of Search ............. 437/31, 915, 974; 148/DIG. 135, DIG. 10, DIG. 11

[56] References Cited

U.S. PATENT DOCUMENTS

| | | | |
|---|---|---|---|
| 4,651,410 | 3/1987 | Feygenson | 437/31 |
| 4,728,616 | 3/1988 | Ankri et al. | 437/31 |
| 4,981,807 | 1/1991 | Jambotkar | 437/31 |

FOREIGN PATENT DOCUMENTS

| | | | |
|---|---|---|---|
| 8906444 | 7/1989 | European Pat. Off. | 437/915 |
| 0219234 | 8/1990 | Japan | 437/31 |

*Primary Examiner*—Brian E. Hearn
*Assistant Examiner*—Tuan Nguyen
*Attorney, Agent, or Firm*—Oblon, Spivak, McClelland, Maier & Neustadt

[57] ABSTRACT

In order to simplify the structure of a power amplifying transistor and improve its high-frequency characteristics, a base electrode (7b) and a collector electrode (7c) are formed on the surface of such a power amplifying transistor, while an emitter electrode (7e) is formed on its rear surface. Since it is possible to easily ground the emitter electrode (7e) and use the base and collector electrodes (7b, 7c) as an input and an output respectively, the structure is simplified and no wiring pattern is required, whereby high-frequency characteristics can be improved.

3 Claims, 9 Drawing Sheets

METHOD OF FABRICATING A SEMICONDUCTOR DEVICE

This is a division of application Ser. No. 07/815,044, filed on Dec. 31, 1991, now U.S. Pat. No. 5,323,056.

BACKGROUND OF THE INVENTION

1. Field of the Invention

The present invention relates to a semiconductor device such as a power amplifying transistor and a method of fabricating the same.

2. Description of the Background Art

FIG. 12 is a sectional view showing the structure of a conventional NPN semiconductor device. As shown in FIG. 12, an N-type epitaxial layer 1 is formed on an N-type semiconductor substrate 8, and a base region (P-type region) 2 is formed on the epitaxial layer 1.

An emitter region (N-type region) 4 is selectively formed on the surface of the base region 2, and this emitter region 4 is connected to an emitter electrode 7e through a metal electrode underlayer 6e for an emitter. Further, a base electrode 7b is formed on a portion, which is provided with no emitter region 4, of the base region 2 through a metal electrode underlayer 6b for a base region.

An oxide film 9 is formed between the emitter electrode 7e and the base electrode 7b, in order to isolate these electrodes from each other.

Further, a collector electrode 7c is formed entirely over the lower surface of the semiconductor substrate 8.

Steps of fabricating this semiconductor device are now described. FIG. 13 shows sectional views for illustrating a method of fabricating the conventional semiconductor device shown in FIG. 12. First, an epitaxial layer 1 is formed on a semiconductor substrate 8, as shown at FIG. 13(a). Then, an oxide film (not shown) is formed on the epitaxial layer 1, and a portion of the oxide film for defining a base region 2 (FIG. 13 shows only this portion) is removed by photolithography. Thereafter boron or the like is implanted into this portion by ion implantation, to define the base region 2 through annealing.

Then, another oxide film 9 is formed on the base region 2 as shown at FIG. 13(b), and a portion of the oxide film 9 for defining an emitter region 4 is removed. Thereafter arsenic, phosphorus or the like is implanted into this portion by ion implantation, to define the emitter region 4 through annealing.

Then, a metal electrode underlayer 6 is formed entirely over the surface of the semiconductor device as shown at FIG. 13(c), and a resist film 10 is applied onto the same. Photolithography is carried out on this resist film 10, to partially remove the same while leaving portions for forming a base electrode 7b and an emitter electrode 7e, thereby exposing the metal electrode underlayer 6.

Thereafter plating is performed through the exposed portions of the metal electrode underlayer 6, serving as energization parts, to form the base electrode 7b and the emitter electrode 7e respectively. The resist film 10 is then removed and thereafter the metal electrode underlayer 6 is also removed through the base electrode 7b and the emitter electrode 7e, serving as masks. Then vacuum deposition is performed entirely over the rear surface of the semiconductor device, to define a collector electrode 7c thereon.

The semiconductor device shown in FIG. 12 can be formed through the aforementioned steps.

FIG. 14 is a package diagram showing a wiring state of a plurality of such semiconductor devices, which are connected in series with each other through a common emitter. As shown in FIG. 14, a plurality of (in this figure, three) chip bonding patterns 22 are formed on a dielectric member 21, and semiconductor chips 23, each having the structure shown in FIG. 12, are carried out on the respective chip bonding patterns 22.

Collector electrodes provided on the rear surfaces of the semiconductor chips 23 are connected to the chip bonding patterns 2 through solder members. Further, emitter electrodes 24e to 26e of the semiconductor chips 23 are connected through wires to a grounding pattern 31, which in turn is grounded by grounding through holes 31g.

An input part 27 is first connected to a base electrode 24b of the first-stage chip 23, and the chip bonding pattern 22 carrying the first-stage chip 23 thereon is connected to a base electrode 25b of the second-stage chip 23, while the chip bonding pattern 22 carrying the second-stage chip 23 thereon is connected to a base electrode 26b of the third-stage chip 23, and the chip bonding pattern 22 carrying the third-stage chip 23 thereon is connected to an output part 28, respectively through wires.

In the conventional semiconductor device having the aforementioned structure, the base electrode 7b and the emitter electrode 7e are formed on its surface while the collector electrode 7c is formed on its rear surface.

In general, a high-frequency power amplifying transistor is employed in a common emitter manner as described above, while its base and collector serve as an input and an output respectively.

Therefore, when a plurality of such devices are connected in series as shown in FIG. 14, it is necessary to solder the collector electrode 7c, which is provided on the rear surface of each semiconductor device, onto a printed board or the like. In this case, it is necessary to connect the emitter electrode 7e to the substrate by a wire in order to ground the same, while it is necessary to connect a collector, serving as an output, to the base electrode 7b of the next-stage transistor from the substrate by a wire.

However, such a structure is complicated and high-frequency characteristics are deteriorated by inductances of the wires.

In order to integrate such devices, further, it is necessary to take a complicated floating collector structure for exposing the collector electrodes on the surface sides. In this case, collector resistance values are increased due to the floating collector structure, to significantly deteriorate high-frequency characteristics.

SUMMARY OF THE INVENTION

A semiconductor device according to the present invention comprises a first conductivity type base region, a base electrode formed on a top surface of the semiconductor device to be electrically connected with the base region, a second conductivity type collector region selectively formed on a top upper surface of the base region to be in contact with the base region, a collector electrode formed on the top surface of the semiconductor device to be electrically connected with the collector region, a second conductivity type emitter region selectively formed on a rear surface of the base region to be in contact with the base region, and an emitter electrode formed on a rear surface of the semiconductor device to be electrically connected with the emitter region.

A method of fabricating a semiconductor device according to the present invention comprises the steps of preparing a high-resistance semiconductor layer, selectively forming a second conductivity type emitter region on a top surface of the high-resistance semiconductor layer, forming a first conductivity type base region on the top surface of the high-resistance semiconductor layer provided with the emitter region, selectively forming a second conductivity type collector region on the base region, selectively forming a second conductivity type semiconductor region, to be in contact with the emitter region, on a rear surface of the high-resistance semiconductor layer, and forming a collector electrode, a base electrode and an emitter electrode on the collector region, the base region and a rear surface of the high-resistance semiconductor layer provided with the semiconductor region, respectively.

In the semiconductor device according to the present invention, the base electrode which is electrically connected with the base region is provided on the top surface of the semiconductor device and the collector region is selectively provided on the top surface of the base region, while the collector electrode, which is electrically connected with the collector region, is provided on the top surface of the semiconductor device, the emitter region is selectively provided on the rear surface of the base region and the emitter electrode, which is electrically connected with the emitter region, is provided on the rear surface of the semiconductor device, whereby the emitter electrode can be easily grounded and the collector electrode can be easily connected with the base electrode. Further, wiring is simplified and deterioration of high-frequency characteristics can be prevented when the semiconductor device is applied to a power amplifying transistor having a base and a collector serving as an input and an output respectively, while integration of such devices is also simplified.

In the method of fabricating a semiconductor device according to the present invention, the emitter region is selectively formed on the top surface of the high-resistance semiconductor layer, the base region is formed on the high-resistance semiconductor layer, which is provided with the emitter region, the collector region is selectively formed on the base region, the semiconductor region, to be in contact with the emitter region, is selectively formed on the rear surface of the high-resistance semiconductor layer, and the collector electrode, the base electrode and the emitter electrode are formed on the collector region, the base region and the rear surface of the high-resistance semiconductor layer, which is provided with the semiconductor region, whereby the emitter electrode can be formed on the rear surface of the semiconductor device while the base and collector electrodes can be formed on the surface of the semiconductor device, respectively, and it is possible to easily form a semiconductor device having the aforementioned excellent effects.

Accordingly, it is an object of the present invention to obtain a semiconductor device having a simple structure, whose high-frequency characteristics are not deteriorated.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
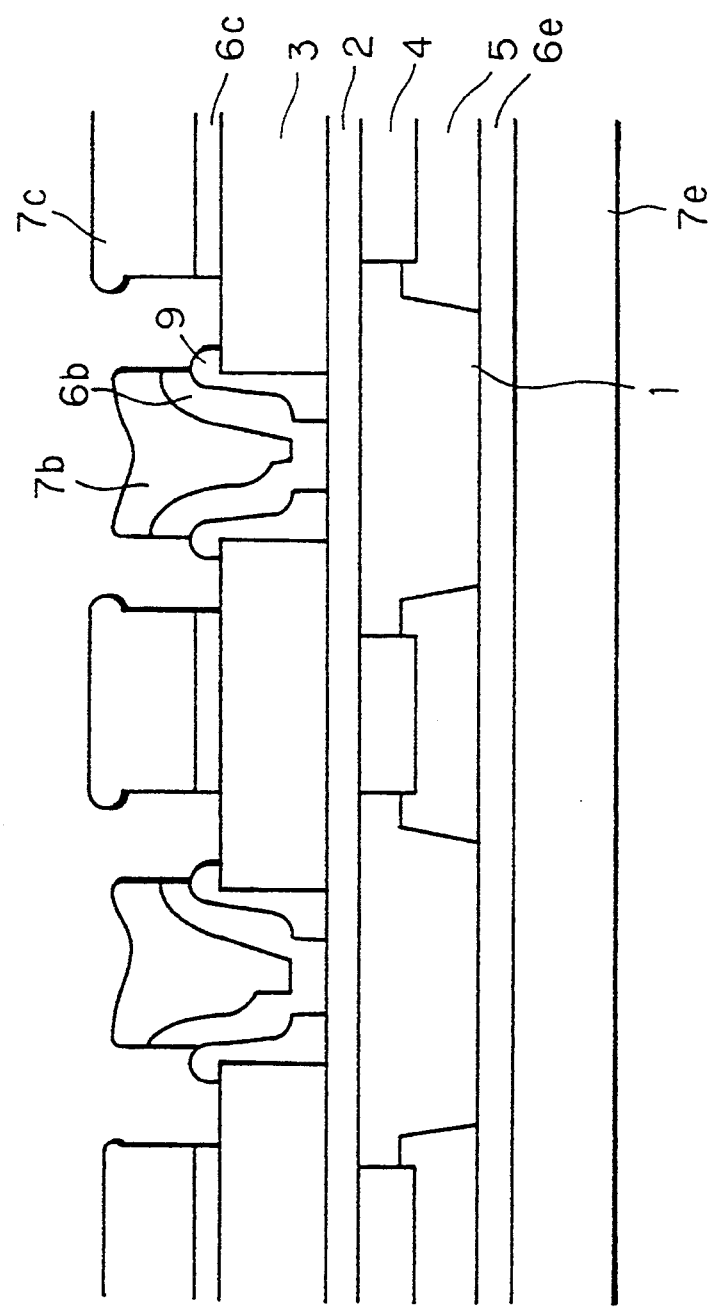
FIG. 1 is a sectional view showing an embodiment of a semiconductor device according to the present invention.

FIG. 1 is a sectional view showing an embodiment of a semiconductor device according to the present invention. As shown in FIG. 1, a base region (P-type region) 2 is formed on the upper surface of an epitaxial layer 1, and a collector region (N-type region) 3 is selectively formed on the base region 2.

An emitter region (N-type region) 4 is selectively formed on the surface of the epitaxial layer 1, and an N-type diffusion layer 5 is selectively formed to cover the rear surface of the emitter region 4 and reach the rear surface of the epitaxial layer 1.

A metal electrode underlayer 6c for a collector region is formed on the collector region 3, and a collector electrode 7c is formed thereon. An oxide film 9 and a metal electrode underlayer 6b for a base region are successively stacked on a portion, provided with no collector region 3 on its upper surface, of the base region 2, and a base electrode 7b is further formed thereon. A metal electrode underlayer 6e for an emitter is commonly formed on the rear surface of the N-type diffusion layer 5, which is connected with the emitter region 4, and the rear surface of the epitaxial layer 1, and an emitter electrode 7e is further formed thereon.

Figure 2:
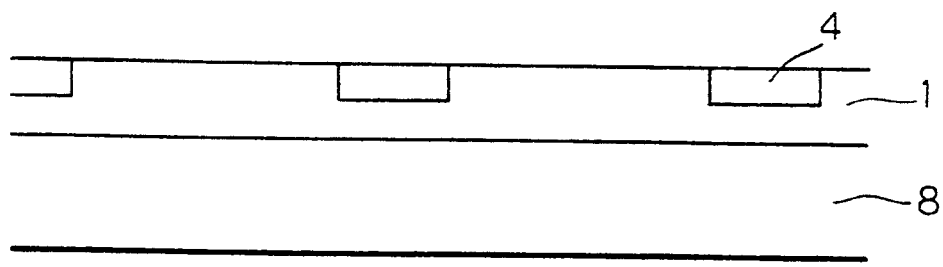
FIG. 2 is a sectional view showing a first step of forming the semiconductor device shown in FIG. 1.

A method of fabricating such a semiconductor device is now described. FIGS. 2 to 8 are sectional views showing an embodiment of the inventive method of fabricating a semiconductor device. First, an epitaxial layer 1 having extremely high resistivity with impurity concentration which is substantially identical to that of an isolation layer is grown on a semiconductor substrate 8, as shown in FIG. 2. A resist film (not shown) is applied onto the surface of the epitaxial layer 1 and a portion for defining an emitter region 4 is removed by photolithography or the like. Then, the emitter region 4 is formed by implanting an impurity such as arsenic or phosphorus through the resist film, serving as a mask. The emitter region 4 may have surface impurity concentration of about $10^{20}$ to $10^{21}/cm^3$ and a width of about 0.05 to 0.1 μm.

Figure 3:
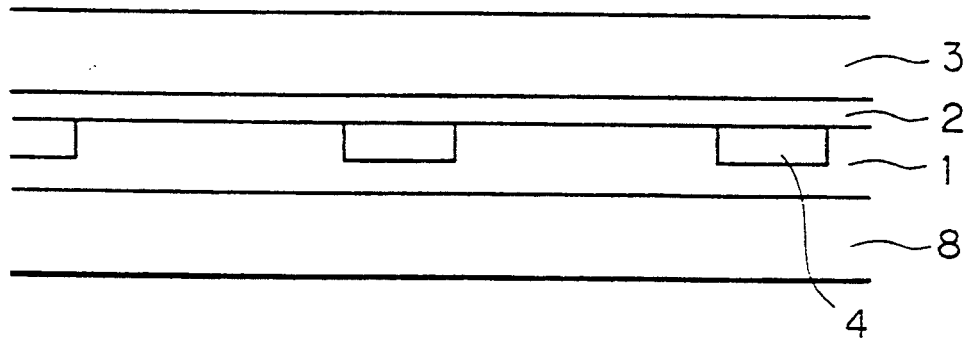
FIG. 3 is a sectional view showing a second step of forming the semiconductor device shown in FIG. 1.

Then, as shown in FIG. 3, a P-type high-concentration epitaxial layer having surface impurity concentration of about $10^{19}$ to $10^{20}$ cm$^3$, for example, is grown on a portion (overall surface in the shown section) of the upper surface of the epitaxial layer 1 to be provided with a base region 2 in a width of 0.15 to 0.2 μm, to form the base region 2. Further, an N-type epitaxial layer having surface impurity concentration of about $10^{16}$ to $10^{17}/cm^3$, for example, is grown on the overall surface of the base region 2 in a width of about 3 to 6 μm, to form a collector region 3.

Figure 4:
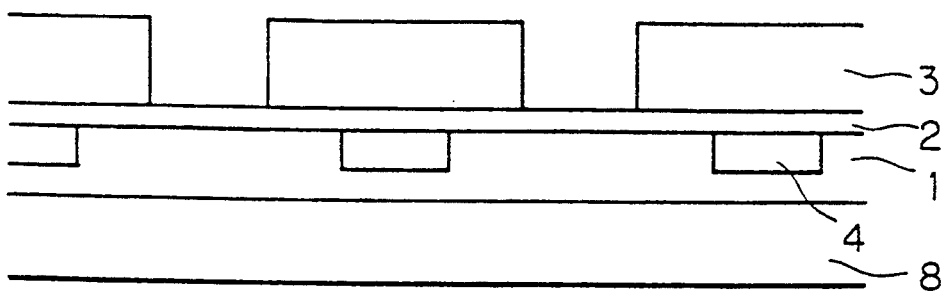
FIG. 4 is a sectional view showing a third step of forming the semiconductor device shown in FIG. 1.

Then, as shown in FIG. 4, a resist film (not shown) is formed on the collector region 3, and the resist film is so patterned as to expose a portion, provided with no emitter region 4 on its lower surface, of the collector region 3 by photolithography. The collector region 3 is etched through the patterned resist film, serving as a mask, thereby removing the portion of the collector region 3 which is provided with no emitter region 4 on its lower surface.

Figure 5:
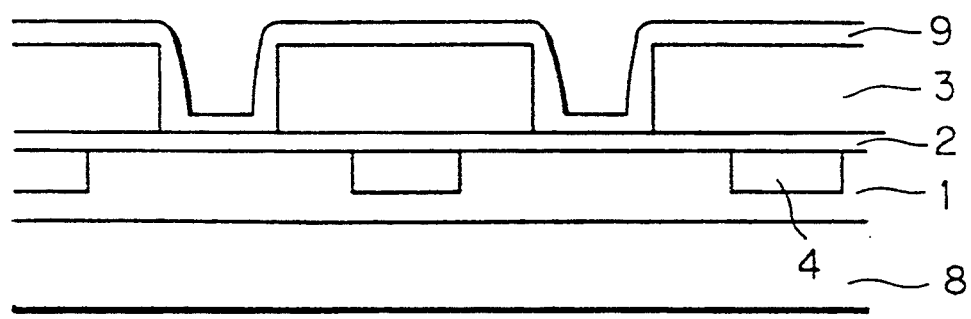
FIG. 5 is a sectional view showing a fourth step of forming the semiconductor device shown in FIG. 1.

Then, an oxide film 9 is formed to cover the collector region 3 and the base region 2, as shown in FIG. 5.

Figure 6:
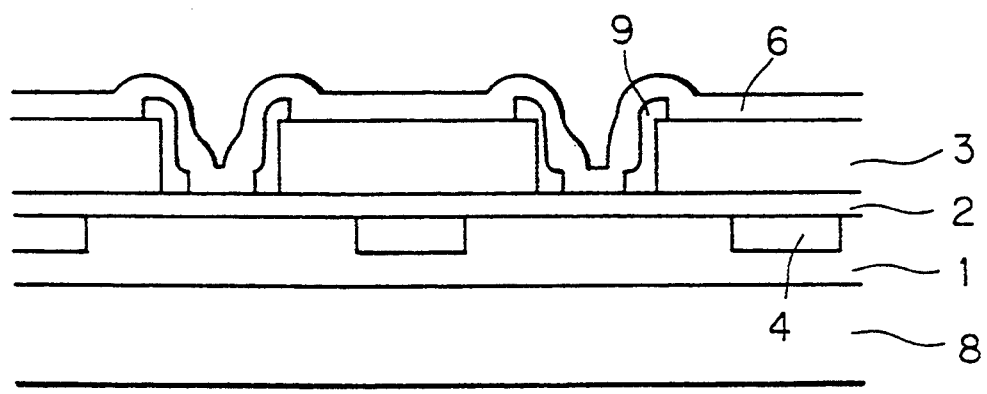
FIG. 6 is a sectional view showing a fifth step of forming the semiconductor device shown in FIG. 1.

Then, as shown in FIG. 6, the oxide film 9 is selectively removed by selective etching using photolithography, to leave a portion of the oxide film 9 only on the side wall of the collector region 3. Thereafter a metal electrode underlayer 6, which is made of metal (example: Ti-W/Au), is deposited on the overall surface.

Figure 7:
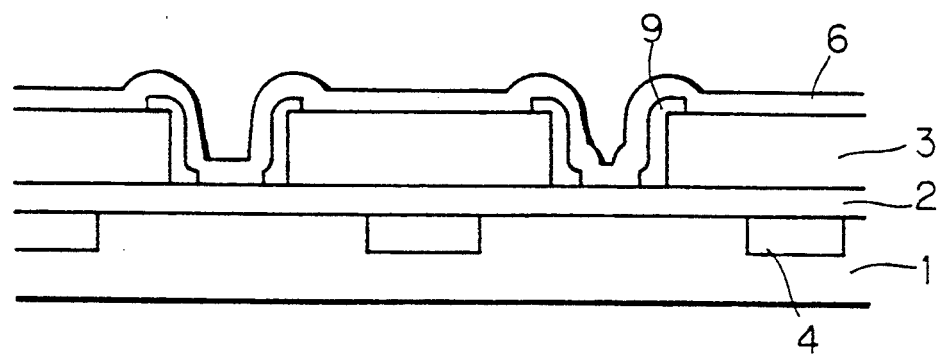
FIG. 7 is a sectional view showing a sixth step of forming the semiconductor device shown in FIG. 1.

In this state, the semiconductor substrate 8 is etched from the rear surface until the epitaxial layer 1 is exposed. FIG. 7 shows a structure attained as the result.

Figure 8:
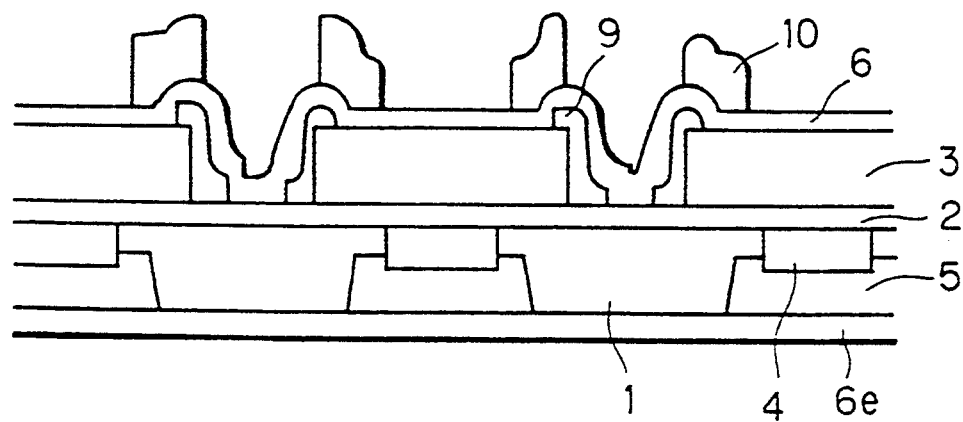
FIG. 8 is a sectional view showing a seventh step of forming the semiconductor device shown in FIG. 1.

Then, as shown in FIG. 8, a resist film (not shown) is applied onto the overall rear surface of the semiconductor device and a portion of the resist film corresponding to the emitter region 4 is selectively removed. Thereafter an impurity such as phosphorus or arsenic is implanted and annealing is performed, thereby forming an N-type diffusion layer 5 to be in contact with the emitter region 4.

Thereafter a metal electrode underlayer 6e for an emitter is deposited on the rear surface of the semiconductor device. Further, a resist film 10 is applied onto the surface of the semiconductor device, and portions of the resist film 10 for defining a base electrode 7b and an emitter electrode 7e are selectively removed. Then, plating is performed through the metal electrode underlayers 6 and 6e, serving as electrodes, thereby forming the base electrode 7b and the collector electrode 7c on the surface while forming an emitter electrode 7e on the rear surface. After the resist film 10 is removed, the base and collector electrodes 7b and 7c are employed as masks to selectively remove the metal electrode underlayer 6 while leaving the metal electrode underlayers 6b and 6e for a base and a collector, whereby it is possible to form the semiconductor device having the structure shown in FIG. 1.

Figure 9:
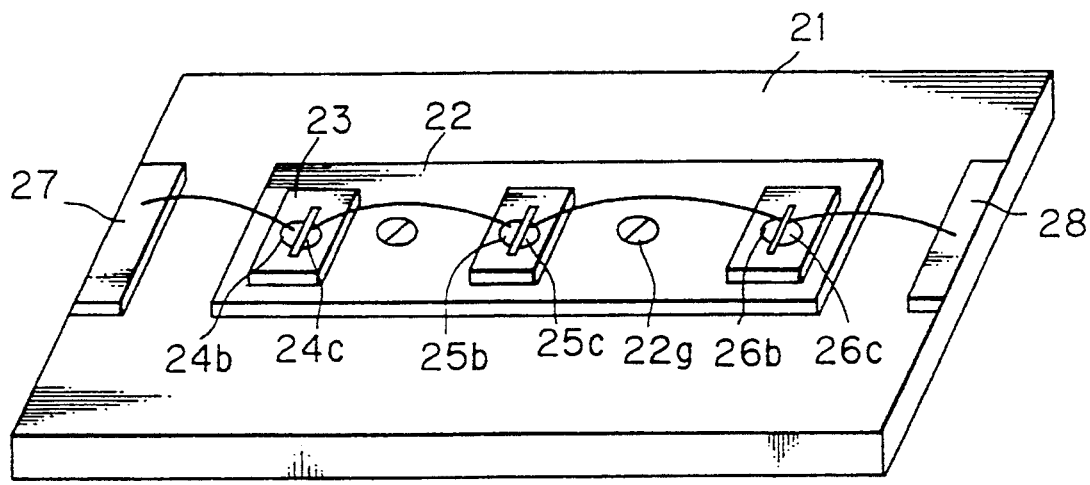
FIG. 9 is a package diagram showing the semiconductor device of FIG. 1 in a discrete state.

FIG. 9 is a package diagram showing a wiring state of a plurality of such semiconductor devices, which are connected in series with each other through a common emitter. As shown in FIG. 9, a chip bonding pattern 22 is formed on a dielectric member 21, and an emitter electrode which is provided on the rear surface of a semiconductor chip 23, having the structure shown in FIG. 1 and being carried on the chip bonding pattern 22, is connected by a solder member to the chip bonding pattern 22, which is grounded by a grounding through hole 22g. Thus, the emitter electrode can be easily grounded. Therefore, it is possible to easily form a power amplifying transistor assembly through a plurality of transistors which are connected in series with each other, by connecting an input part 27 to a base electrode 24b of a first-stage chip 23 by a bonding wire, connecting a collector electrode 24c of the first-stage chip 23 to a base electrode 25b of a second-stage chip 23 and connecting a collector electrode 25c of the second-stage chip 23 to a base electrode 26b of a third-stage chip 23 by bonding wires respectively while connecting a collector electrode 26c of the third-stage chip 23 to an output part 28 by a bonding wire. According to this embodiment, no bonding wire is required for grounding an emitter, whereby the structure is simplified and deterioration of high-frequency characteristics caused by wire inductances is prevented.

Figure 10:
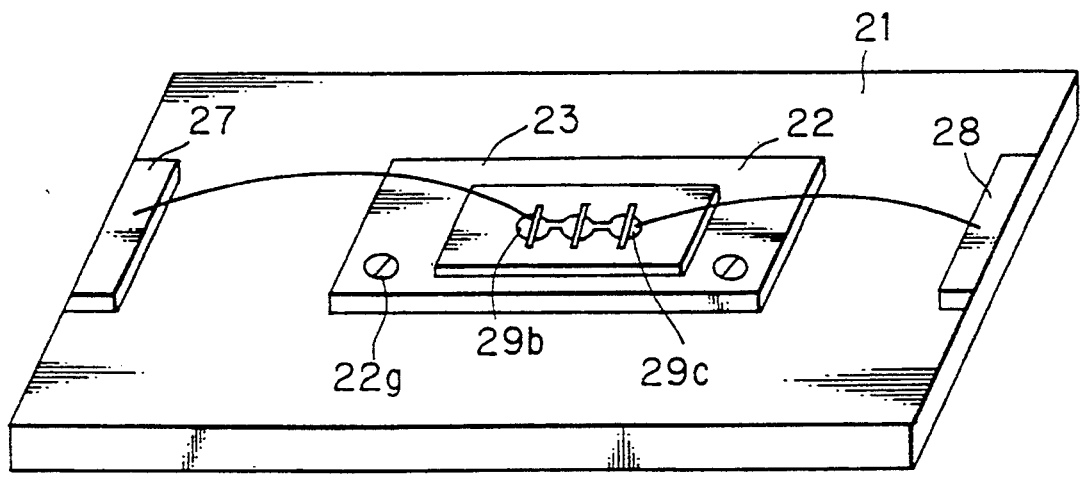
FIG. 10 is a package diagram showing an integrated state of the semiconductor device shown in FIG. 1.

FIG. 10 is a package diagram showing a wiring state of three discrete transistors shown in FIG. 9, which are integrated into one chip. Also in this case, it is possible to easily form a power amplifying transistor assembly through a plurality of transistors which are connected in series with each other, by connecting an input part 27 to a base electrode 29b of a first-stage transistor in an integrated chip 23 by a bonding wire and connecting a collector electrode 29c of a last-stage transistor in the integrated chip 23 to an output part 28 by a bonding wire, since an emitter electrode, provided on the rear surface of the chip 23, which is common to the respective transistors is already grounded similarly to the above.

Figure 11:
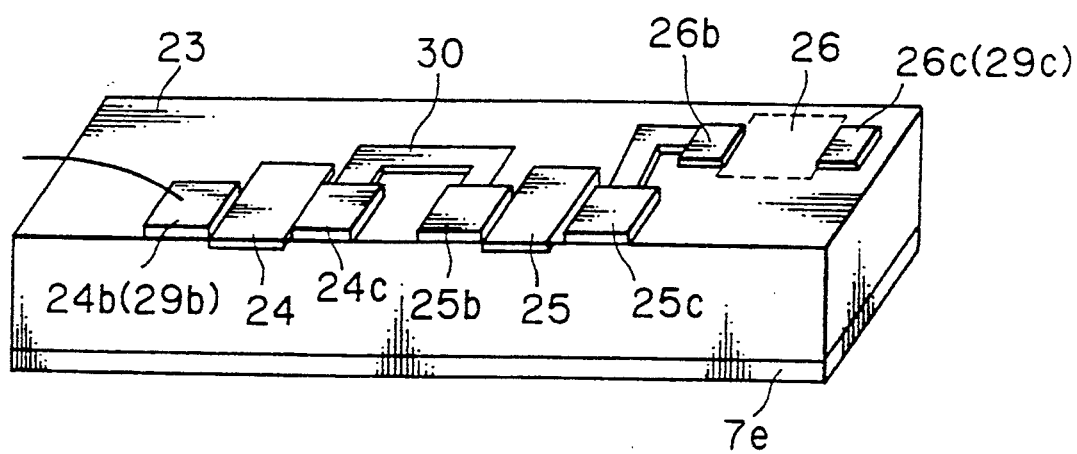
FIG. 11 is a partially fragmented perspective view showing a section of the integrated circuit shown in FIG. 10.
Figure 12:
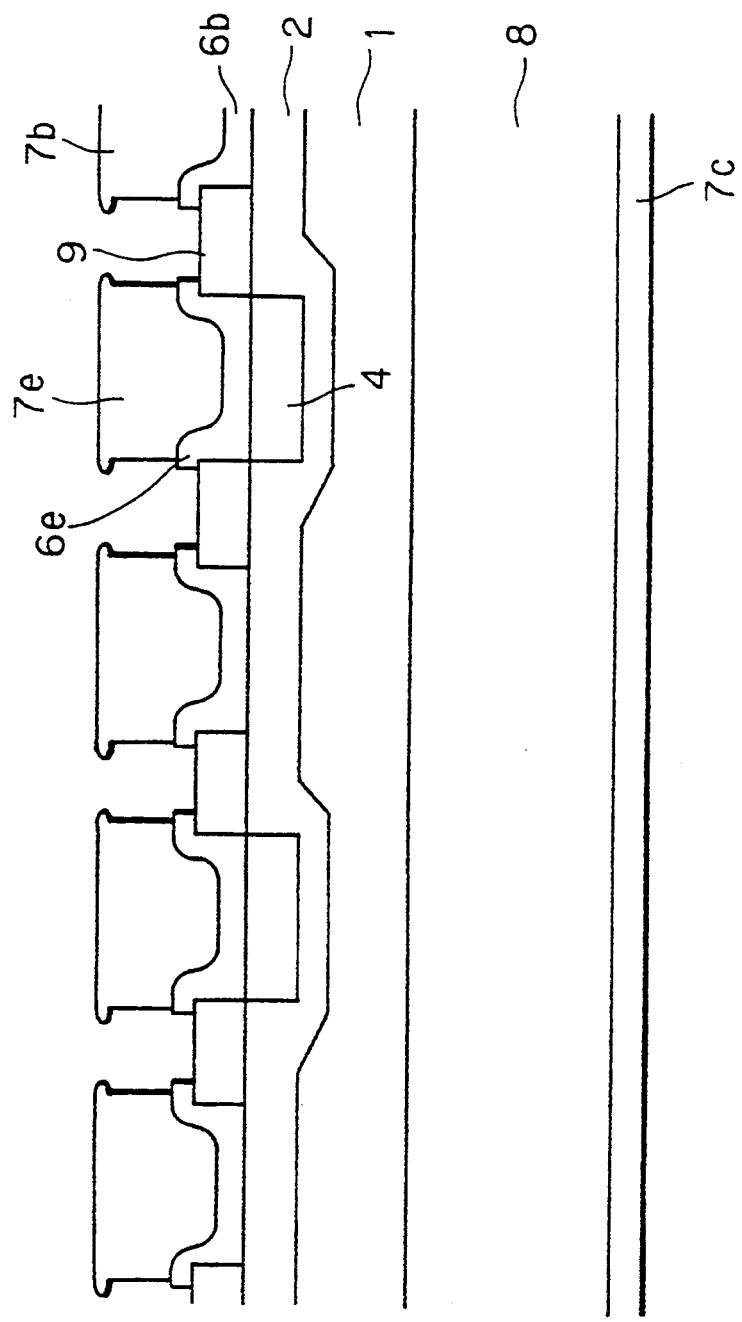
FIG. 12 is a sectional view showing a conventional semiconductor device.
Figure 13A:
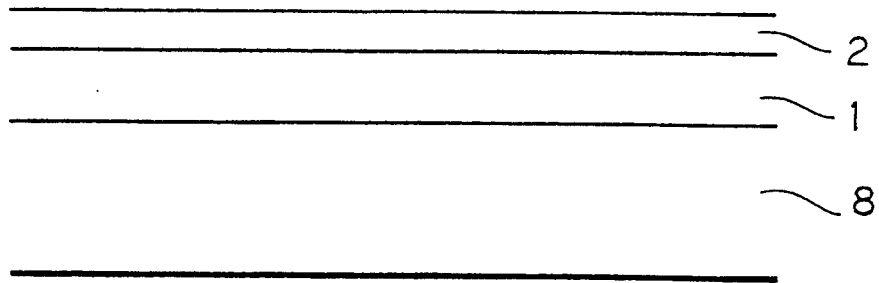
FIGS. 13(a)–13(c) illustrate sectional views showing a method of forming the semiconductor device shown in FIG. 12.
Figure 13B:
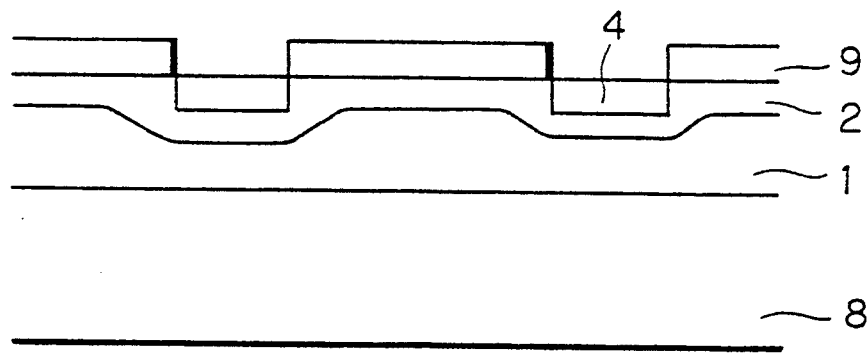
Figure 13C:
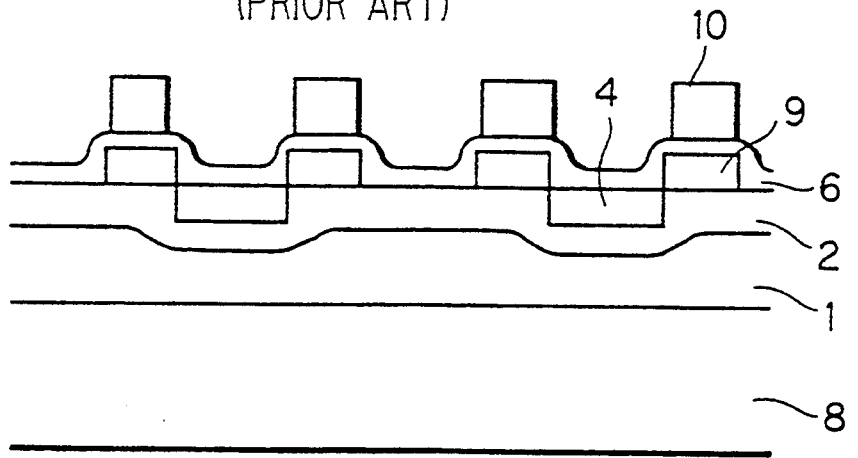
Figure 14:
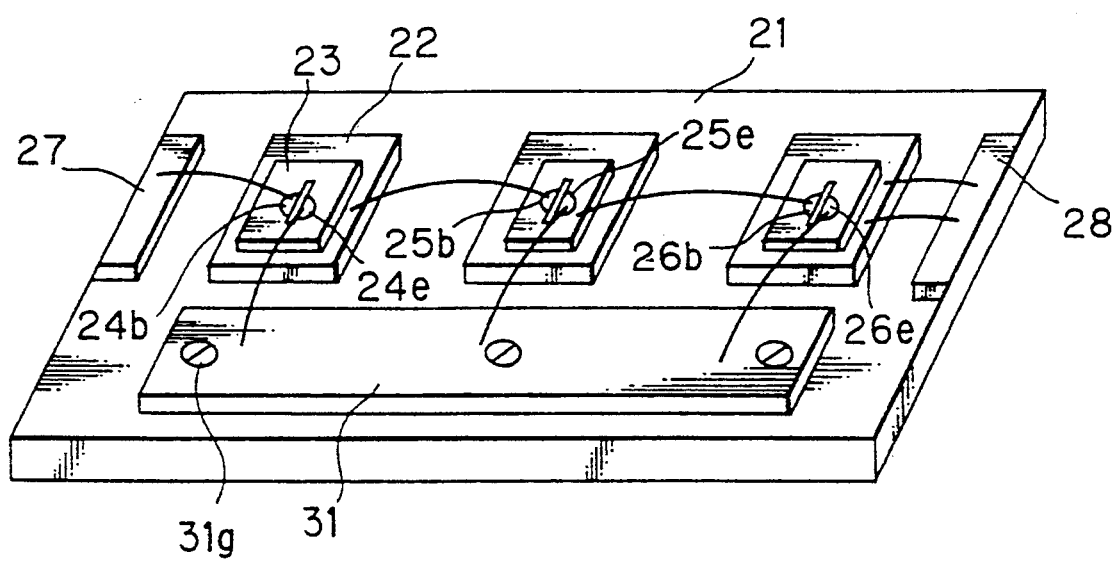
FIG. 14 is a package diagram of the semiconductor device shown in FIG. 12.

FIG. 11 is a partially fragmented perspective view showing a section of the integrated chip 23 shown in FIG. 10.

In transistor parts 24, 25 and 26, each having a similar structure to that shown in FIG. 1, a collector electrode 24c of the first-stage transistor part 24 is connected with a base electrode 25b of the second-stage transistor part 25 while a collector electrode 25c of the second-stage transistor part 25 is connected with a base electrode 26b of the third-stage transistor part 26 by transistor connecting patterns 30, such as microstriplines, provided on the chip 23, as shown in FIG. 11. Further, an emitter electrode 7e, which is common to the transistor parts 24, 25 and 26, is provided entirely over the rear surface of the chip 23, so that the same can be easily grounded as hereinabove described.

According to this embodiment, not only a bonding wire for grounding the emitter but also bonding wires for connecting bases and collectors can be removed, whereby the structure is greatly simplified and it is possible to sufficiently prevent deterioration of high-frequency characteristics caused by wire inductances.

According to the present invention, as hereinabove described, it is possible to form the base and collector electrodes 7b and 7c on the surface of the semiconductor device while forming the emitter electrode 7e on the rear surface of the semiconductor device. Since the emitter electrode is provided on the rear surface, the emitter can be easily grounded as a power amplifying transistor. Since the base and collector electrodes are provided on the surface, further, a plurality of transistors can be easily integrated with microstriplines or the like when such a plurality of transistors are connected in series with each other through a common emitter.

Although the above embodiment has been described with respect to an NPN transistor, such a transistor may alternatively be formed as that of a PNP type by changing the type of the dopant, and an effect similar to the above is attained also in this case.

Although the above embodiment has been described with respect to electrodes which are formed by plating, a similar effect can also be attained when the electrodes are formed by vacuum deposition.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a semiconductor device having a base of a first conductivity type and an emitter and a collector of a second conductivity type, said method comprising the steps of:

preparing a substantially isolating layer;

selectively forming a plurality of emitter regions of said second conductivity type within an upper surface of said substantially isolating layer by introducing an impurity of said second conductivity type into said upper surface of said substantially isolating layer;

forming a base region of said first conductivity type on said upper surface of said substantially isolating layer provided with said plurality of emitter regions;

selectively forming a plurality of collector regions of said second conductivity type on said base region, opposite to said plurality of emitter regions, respectively;

selectively forming a plurality of semiconductor regions of said second conductivity type within a rear surface of said substantially isolating layer by introducing an impurity of said second conductivity type into said rear surface of said isolating layer, said plurality of collector regions contacting said plurality of emitter regions, respectively; and forming a collector electrode, a base electrode, and an emitter electrode on said collector region, said base region, and said rear surface of said isolating layer provided with said semiconductor regions, respectively.

2. A method of fabricating a semiconductor device according to claim 1, wherein said step of preparing a substantially isolating layer includes the steps of preparing a semiconductor substrate, and epitaxially growing said substantially isolating layer on said semiconductor substrate, and wherein said method further comprises the step of removing said semiconductor substrate prior to said step of selectively forming a plurality of semiconductor regions of said second conductivity type.

3. A method of fabricating a semiconductor device according to claim 1, wherein said step of selectively forming a plurality of collector regions of said second conductivity type includes the steps of:

growing an epitaxial layer of said second conductivity type on said base region; and selectively removing said epitaxial layer to form said plurality of collector regions.

* * * * *